(12) United States Patent
Samila

(10) Patent No.: US 8,331,067 B2
(45) Date of Patent: Dec. 11, 2012

(54) METHOD AND APPARATUS FOR MOVING MATERIAL

(75) Inventor: John Samila, Porter, IN (US)

(73) Assignee: Ephaugh, Inc., Westmont, IL (US)

( * ) Notice: Subject to any disclaimer, the term of this patent is extended or adjusted under 35 U.S.C. 154(b) by 363 days.

(21) Appl. No.: 12/649,055

(22) Filed: Dec. 29, 2009

(65) Prior Publication Data

US 2010/0157489 A1 Jun. 24, 2010

Related U.S. Application Data

(63) Continuation-in-part of application No. 12/002,527, filed on Dec. 17, 2007, now Pat. No. 7,795,747, which is a continuation-in-part of application No. 11/766,945, filed on Jun. 22, 2007, now Pat. No. 7,791,856.

(60) Provisional application No. 60/900,674, filed on Feb. 9, 2007.

(51) Int. Cl.
*H02H 3/00* (2006.01)
*H02H 9/08* (2006.01)

(52) U.S. Cl. ............... 361/42; 361/43; 361/44; 361/45; 361/46; 361/47; 361/48; 361/49; 361/50

(58) Field of Classification Search ................ 361/42
See application file for complete search history.

(56) References Cited

U.S. PATENT DOCUMENTS

| 3,505,566 A * | 4/1970 | Conrad ..................... 361/44 |
| 4,647,268 A | 3/1987 | Scholl |
| 5,172,289 A * | 12/1992 | Zelm ......................... 361/23 |
| 5,751,126 A | 5/1998 | Hellinger et al. |
| 5,959,416 A | 9/1999 | Clutter et al. |
| 5,998,944 A | 12/1999 | Clutter et al. |
| 7,295,016 B2 * | 11/2007 | Kishibata et al. .......... 324/522 |

FOREIGN PATENT DOCUMENTS

| KR | 20-1998-0042959 U | 9/1998 |
| KR | 20-0220758 Y1 | 4/2001 |

* cited by examiner

*Primary Examiner* — Dharti Patel
(74) *Attorney, Agent, or Firm* — Factor Intellectual Property Law Group, Ltd.

(57) ABSTRACT

An apparatus and method for providing ground fault protection to a lifting device utilizing an electromagnet and powered by a generator. The apparatus and method rectifies an AC voltage emanating from the generator source and monitors unsafe operating conditions of the generator's circuit wherein operation of the lifting device is ceased when predetermined electrical operating parameters are exceeded.

2 Claims, 5 Drawing Sheets

METHOD AND APPARATUS FOR MOVING MATERIAL

RELATED APPLICATIONS

This application is a continuation-in-part patent application claiming priority benefit to the filing date of U.S. patent application Ser. No. 12/002,527, filed Dec. 17, 2007 now U.S. Pat. No. 7,795,747; which is a continuation-in-part patent application claiming priority benefit to the filing date of U.S. patent application Ser. No. 11/766,945, filed Jun. 22, 2007 now U.S. Pat. No. 7,791,856; which is a patent application claiming priority benefit to the filing date of U.S. Provisional Patent Application No. 60/900,674, filed Feb. 9, 2007; the contents of all of these applications are expressly incorporated herein by reference.

TECHNICAL FIELD

The innovation relates generally to the field of lifting devices and more specifically, to a method and apparatus for providing ground fault circuit protection for a lifting device utilizing an electromagnet for attaching, lifting, moving, releasing, and dropping magnetic material.

BACKGROUND OF THE INVENTION

The material handling industry utilizes a variety of mechanisms to lift, move, and place materials such as scrap or finished products. For relocating magnetic materials, e.g., diamagnetic metals, paramagnetic metals, and ferromagnetic metals; an electromagnet is preferable in many cases because it does not require personnel to position the chains, hooks, and other mechanical grasping mechanisms often utilized during the attachment and release of the magnetic material. Such grasping mechanisms can further mar metal surfaces and increase the possibility of product damage.

One drawback to using an electromagnetic lifting device is that the magnetic material may not readily release from the electromagnet when operated to do so. For instance, when the power source to the electromagnet is removed, the magnetic material may not immediately release and will stay attached to the electromagnet, but may eventually drop due to the force of gravity. As such, it is common to temporarily reverse the polarity of the electromagnet to repel or "push" the magnetic material from the electromagnet. The magnitude of the reverse force can be significant and as a result, some magnetic materials—e.g., ferromagnetic—may be re-attracted to a now oppositely charged electromagnet and not drop; or if released, will itself retain an undesired residual magnetism. To effect a clean drop, several factors should be considered and compensated for, including, and not limited to the operating characteristics of the electromagnet and the generator, as well as the load, temperature, and velocity of the generator.

When operating electromagnet equipment that utilizes dangerously high voltage levels, operator safety is also a major concern. A variety of safety mechanisms, e.g., circuit-breakers, have been available for safely securing machinery against ground faults, e.g., electrical shorts. One such common ground fault circuit interrupt (GFCI) is typically incorporated with electrical machinery; however the GFCI is not easily adaptable for use in electromagnetic moving equipment, which is possibly due in part to the bipolar voltage nature of the electromagnetic magnet and generator.

An innovation described herein is provided to address these and other issues.

SUMMARY OF THE INVENTION

The innovation is directed to a method and apparatus for ensuring safe operation of a system for moving material. More specifically, the method and/or apparatus include(s) a safety mechanism/circuit for an electromagnetic lifting device powered by a generator source. The safety mechanism includes an AC to DC rectifier bridge having two inputs and a positive output and a negative output. The two inputs are coupled to the generator source. A ground trip relay coil, which includes a predetermined safe current resistor, is coupled to the negative output of the AC to DC voltage rectifier bridge. The resistor is coupled between the ground trip relay coil and ground. And, a shunt trip and ground trip relay contact are coupled in series between the positive terminal of the AC to DC rectifier bridge and ground, wherein detection of a current level above the predetermined safe current level will energize the ground trip relay coil, thus tripping the ground trip relay contact and further opening the shunt trip.

Another aspect of the innovation includes a method and apparatus for ensuring safe operation of a system for moving material wherein a mechanism is provided for adapting to electrical current leakage to ground affecting the system, which may alter the level of the system's ground potential, and thus affect its performance.

An object of the innovation is to provide a mechanism to more safely operate a material handling apparatus utilizing an electromagnet for relocating magnetic material.

Another object of the innovation is to provide a method and apparatus for detecting an unsafe operating condition for a material handling apparatus utilizing an electromagnet irrespective of the apparatus' operating mode, e.g., lift, drop.

A further object of the innovation is to provide a method and apparatus for ceasing operation of a material handling apparatus utilizing an electromagnet upon detection of an unsafe operating condition.

These and other aspects and attributes of the innovation will be discussed with reference to the following drawings and accompanying specification and claims.

DETAILED DESCRIPTION OF THE EMBODIMENT

Figure 1:
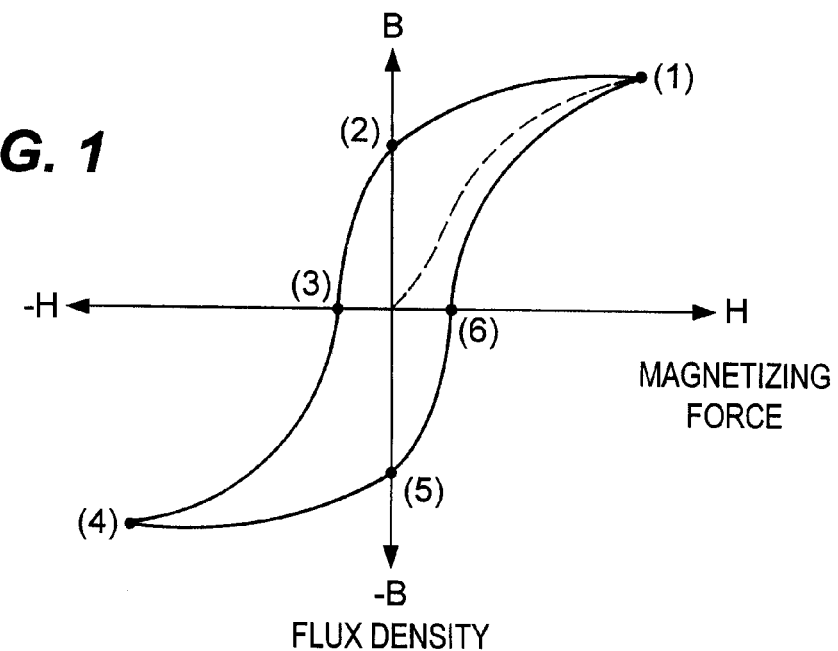
FIG. 1 is a graphic illustration depicting the relationship between an induced magnetic flux density and a magnetizing force.

While the innovation is susceptible of embodiment in many different forms, there is shown in the drawings and will herein be described in detail preferred embodiments of the innovation with the understanding that the present disclosure is to be considered as an exemplification of the principles of the innovation and is not intended to limit the broad aspect of the innovation to the embodiments illustrated.

One embodiment of the innovation is directed to a system for moving magnetic material. The magnetic material is attracted to an electromagnet, lifted, moved to another location, and released from the electromagnet. Preferably, upon release of the magnetic material, all the lifted material is dropped from the electromagnet and any extent of residual magnetic flux retained by the dropped magnetic material is reduced to a desirable level.

FIG. 1 is a graphic illustration of an exemplification depicting the known relationship between an induced magnetic flux density (B) and a magnetizing force (H) that occurs during the attraction and repulsion of a magnetic material. A hysteresis loop is generated by measuring the magnetic flux of a magnetic material, e.g., ferromagnetic, while the magnetizing force is changed. Ferromagnetic material that has never been previously magnetized or has been thoroughly demagnetized will follow the dashed line as the magnetizing force is increased. The greater the amount of magnetizing force, the stronger the magnetic field in the component. At point (1), almost all of the magnetic domains are aligned and any additional increase in the magnetizing force will produce very little increase in magnetic flux. Here, the material has reached the point of magnetic saturation. When the magnetizing force is decreased to zero, the curve will move from point (1) to point (2). At point (2), some magnetic flux remains in the material even though the magnetizing force is zero. This is referred to as the point of retentivity and indicates the level of residual magnetism in the material. That is, some of the magnetic domains remain aligned, but some have lost their alignment. As the magnetizing force is reversed, the curve moves to point (3), where the flux has been reduced to zero. This is known as the point of coercivity, wherein the reversed magnetizing force has flipped enough of the domains such that the net flux within the material is zero.

As the magnetizing force is increased in the negative direction, the material will again become magnetically saturated but in the opposite direction, point (4). Reducing the magnitude of the magnetizing force to zero brings the curve to point (5), and further increasing the magnitude of the magnetizing force in the positive direction will return the flux density to zero, point (6). The curves does not return to its origin because some force is required to remove the residual magnetism and the curve will take a different path from point (6) to the saturation point of point (1).

From the representative hysteresis loop shown in FIG. 1, several magnetic properties of a material can be determined: (a) retentivity is a material's ability to retain a certain level of residual magnetic field when the magnetizing force is removed after achieving saturation, i.e., the amount of flux density at point (2); (b) residual magnetism or residual flux is the magnetic flux density that remains in a material when the magnetizing force is zero; and, (3) coercive force is the amount of reverse magnetic field that must be applied to a magnetic material to make the magnetic flux return to zero, i.e., the amount of magnetizing force at point (3).

Figure 2:
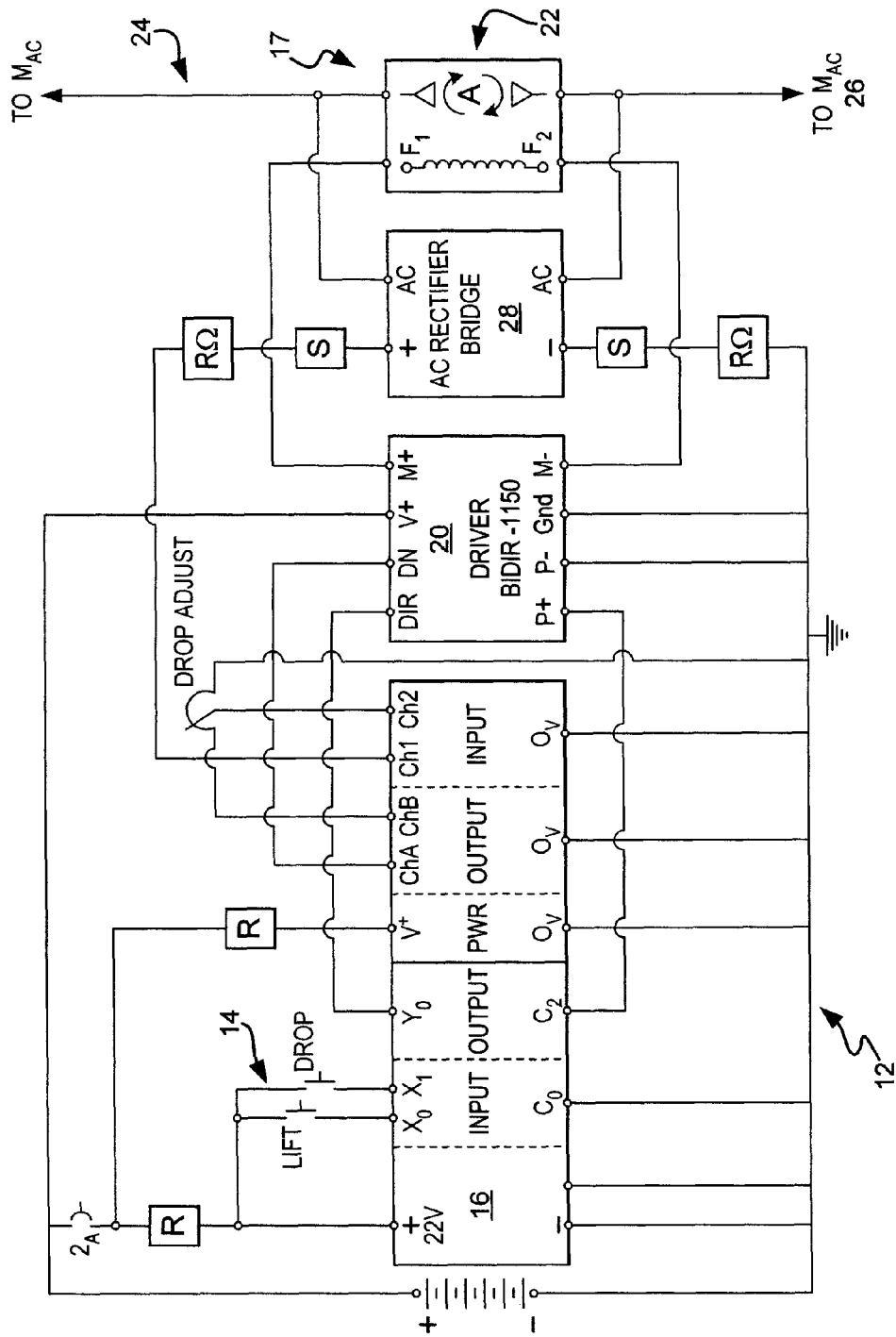
FIG. 2 is a schematic illustration of one embodiment of the innovation utilized in a closed-loop system.

FIG. 2 is a schematic drawing of one embodiment of the innovation depicting a closed-loop electrical circuit 12 for controlling an electromagnet. A closed-loop circuit 12 is such that its armature is always connected to the electromagnet and thus capable of providing related feedback to the controller; as opposed to an open-loop circuit wherein the armature is intermittently coupled to the electromagnet and similar related feedback is thus not provided. The circuit 12 is operatively coupled to a voltage generator 17 and includes an operator interface 14, a controller 16 (CPU, or preferably a programmable logic controller (PLC)), an analog circuit card 19, a voltage driver 20, and an AC to DC voltage rectifier bridge 28.

The operator interface 14 includes inputs, e.g., switches and buttons; and outputs, e.g., lights, displays, and speakers; to enable personnel to operate the moving device. The voltage driver 20 is preferably bidirectional—e.g., integrated circuit BIDIR-115D—and is operatively coupled to the generator field windings 18, which facilitates control of the generator 17. The AC to DC voltage rectifier bridge 28 is operatively coupled to the generator's armature 22, which is also operatively coupled to an electromagnet 26. The AC to DC voltage rectifier bridge 28 acts to align the polarity of the signal received from the generator 17 for further transmission to the controller 16. The output of the AC to DC voltage rectifier bridge 28 is coupled to an input channel—CH1—of the PLC 16.

A pair of control signals—attach (lift) and detach (release or drop)—can emanate from the controller 16 and are transmitted to the generator field 18 via the driver 20. Transmission of the control signal from the controller 16 to the generator's input 18—field windings—affects the polarity and the magnitude of the magnetizing force of the electromagnet 26. That is, the lift control signal transmitted from the controller 16 to the generator field 18 results in a polarized adjustment to the voltage magnitude of the electromagnet 26. Thereafter, transmission of the drop (release) control signal from the controller 16 to the generator field 18 of the generator's armature 22 results in alternating the polarity and adjusting, e.g., reducing, the magnitude of the voltage at the electromagnet 26.

In response to a lift material signal being received from the operator interface 14, the control lift signal is transmitted from the controller 16 to the generator field 18. The output voltage 24 of the armature 22 is monitored by the PLC 16 and further maintained by comparison to a set-point value and by subsequent control signals transmitted to the generator field 18. In short, the PLC 16 monitors the output voltage 24 of the generator 17 and—through the transmission of the control signal to the armature's field winding(s) 18—maintains the generator's output voltage at the desired level, which is substantially equivalent to the set-point value.

The operating sequence for lifting the magnetic material includes actuating the lift procedure via the interface control panel 14 wherein the controller 16 receives a command to initiate attachment of the magnetic material. The controller 16 transmits a lift control signal—24 V(dc)—to the generator field 18 via the DC voltage driver 20 to enable the generation of a voltage output at the generator armature output that is substantially equal to the set-point value for the lift sequence. During the lift sequence, the generator armature output voltage 24 can be compared by the controller 16 to the set-point value to maintain and/or adjust the generator armature output voltage as necessary. The set-point value utilized during the lift sequence is essentially a constant voltage value that is substantially equal to the voltage amount desired to energize the electromagnet, e.g., approximately 230 V(dc).

During the release of the magnetic material, the voltage output 24 of the armature 22 is monitored and fed back to the PLC 16 for comparison to a set-point value for the release or drop sequence. The set-point value for the release or drop sequence is at least partially dependent upon the operating characteristics of the electromagnet 26 and its determination is associated with the release of the largest pieces of magnetic material to be moved by the electromagnet. The set-point value utilized during the release sequence of the magnetic material is partially determined during an initial process wherein the operator monitors the voltage of the electromagnet 26 during a lifting and dropping of magnetic materials. The set-point value for the drop sequence is associated with the analog voltage level of the electromagnet 26 in conjunction with the time required for the largest piece of magnetic material to be released.

Figure 3:
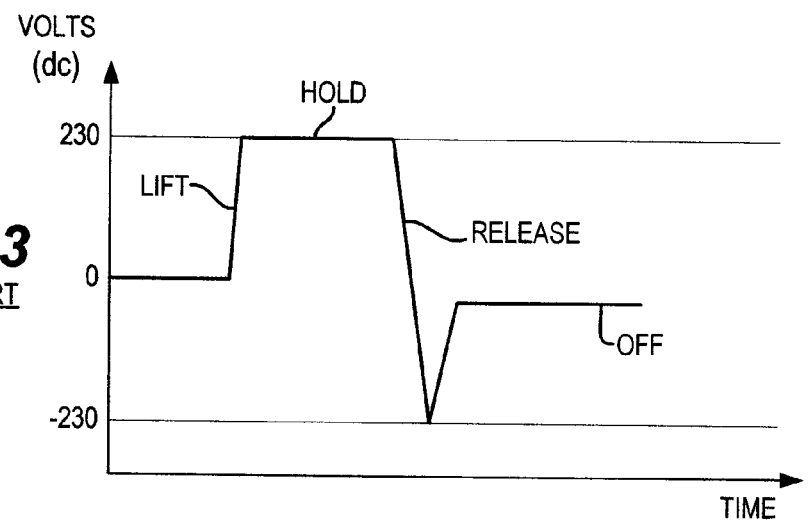
FIG. 3 is a graphic illustration depicting voltage values of a prior art electromagnet during the lift and drop modes.

FIG. 3 is a graphic illustration depicting a voltage of a prior art lifting magnet during the lift and release—or drop—of a magnetic material. Initially, the voltage output of the electromagnet is increased to 230 V(dc) and then remains constant until the polarity of the voltage output from a generator is reversed, which causes the voltage level to drop to approximately −250 V(dc). When the generator is turned off, its voltage output eventually approaches 0 V.

Figure 4:
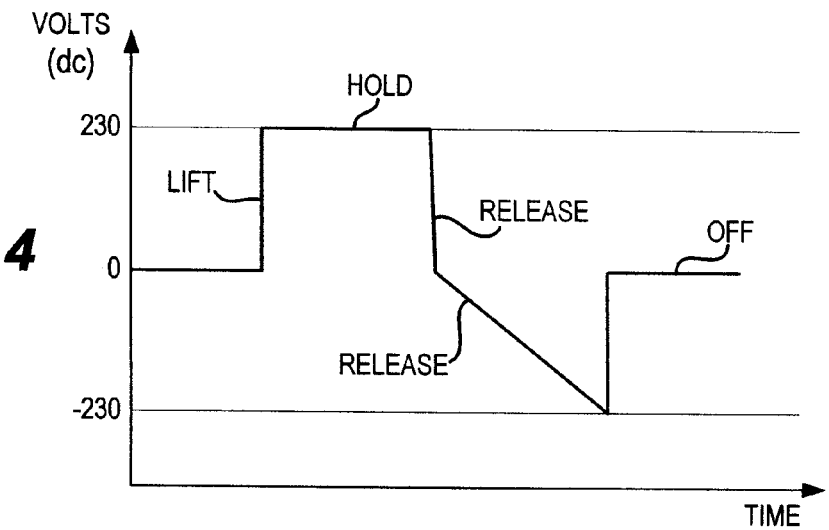
FIG. 4 is a graphic illustration depicting the voltage values of an electromagnet of one embodiment of the innovation during the lift and drop modes.

In contrast, FIG. 4 is a graphic illustration depicting a voltage at the electromagnet 26 of one embodiment of the innovation during the lift and release of the magnetic material. The initial voltage output of the electromagnet 26 is increased to 230 V(dc) and then remains constant until the drop control signal is transmitted from the controller, whereupon the polarity of the electromagnet voltage is effectively reversed so that the attached magnetic material can be released from the electromagnet. During the release of the magnetic material, the generator's output voltage is monitored and maintained in substantial alignment with the set-point value for the release sequence. In contrast to typical release mechanisms wherein the reverse polarized magnitude is essentially unchecked and thus susceptible to re-magnetizing the magnetic material to the electromagnet, the innovative lifting device maintains the voltage output of the armature to that substantially equal to the set-point, which allows for the magnetic material to fall away from the electromagnet and not retain residual magnetism.

More specifically, to drop the magnetic material from the electromagnet 26, the operator initiates the release sequence by actuating the appropriate input on the interface control panel 14 wherein the programmable logic controller 16 enables transmission of the first control signal—drop, −24 V(dc)—to the generator field 18. At about this time, the programmable logic controller 16 monitors the voltage output 24 of the armature 22—process variable—through an input channel (CH1). In response to the voltage output of armature 22 and its relation to the set-point value of the drop sequence (CH2), the PLC will output a control signal (CHA) to the DC driver 20, which is then transmitted into the field winding 18 of the generator 17 to maintain the voltage output 24 of the armature 22 with the set-point value.

The controller 16 utilizes CHA to transmit the control signal to the generator field 18 such that the voltage output 24 of the armature 22 is substantially equal to the set-point value of the drop sequence. If the monitored voltage output 24 of the armature 22 varies from the set-point value during the drop cycle, the controller 16 will adjust the control signal from CHA to the generator field 18 so that the generator's output voltage will be substantially the same as the set-point value of the drop sequence. At the end of the set-point value, the magnetic material will have fallen from the electromagnet 26.

In one embodiment of the innovation, the set-point value for the drop sequence is a substantially linearly ramped voltage signal having a constant slope or rate and a duration of approximately two seconds. The PLC 16 monitors the voltage output of the armature 22 for comparison with the substantially linearly ramped set-point value, wherein subsequent control signals from the PLC—CHA—to the armature field 18 maintains consistency of the armature's output voltage 24 with the set-point value of the drop sequence to ensure release of the magnetic material without voltage overshoot, residual magnetism, and further alterations of polarity and magnitude reduction.

Accordingly, the innovation utilizes the voltage output of a generator to more effectively demagnetize the electromagnet and reduce the amount of residual magnetism remaining on the released magnetic materials. That is, the amount of reluctance in the magnet as measured by the voltage output fed back by the generator's armature is sensed and compared to the predetermined set-point value of the drop sequence, wherein a subsequently transmitted control signal is transmitted in response—at least partially—to the comparison of the sensed output voltage of the generator's armature voltage and the predetermined set-point value of the drop sequence. As such, the innovation takes into consideration any speed or load fluctuation of the generator through constant monitoring of the generator's armature output voltage by the PLC 16 to continually compensate its output signal to the DC driver 20 to maintain the desired generator voltage output 24 as necessary.

The duration and magnitude of the reverse voltage resulting at the electromagnet during the release of the magnetic material is further adjustable by a second input to the controller 16, CH2, which can be set by the operator. For example, a setting adjustment of 50% may equate to a 1.0 second drop time with 115 VDC maximum; a setting of 100% may equate to a 2.0 second drop time with 230 VDC maximum; and a setting of 10% may equate to a 0.2 second drop time with 23 VDC maximum. At the end of the linearly ramped set-point value, the surface of the electromagnet will be clean and the PLC 16 will disable the driver 20.

Additionally, a scaling factor dependent upon the type of load bias applicable to the system, e.g., scrap or deep draw magnets, can also be incorporated into the determination of the ramp signal.

Figure 5:
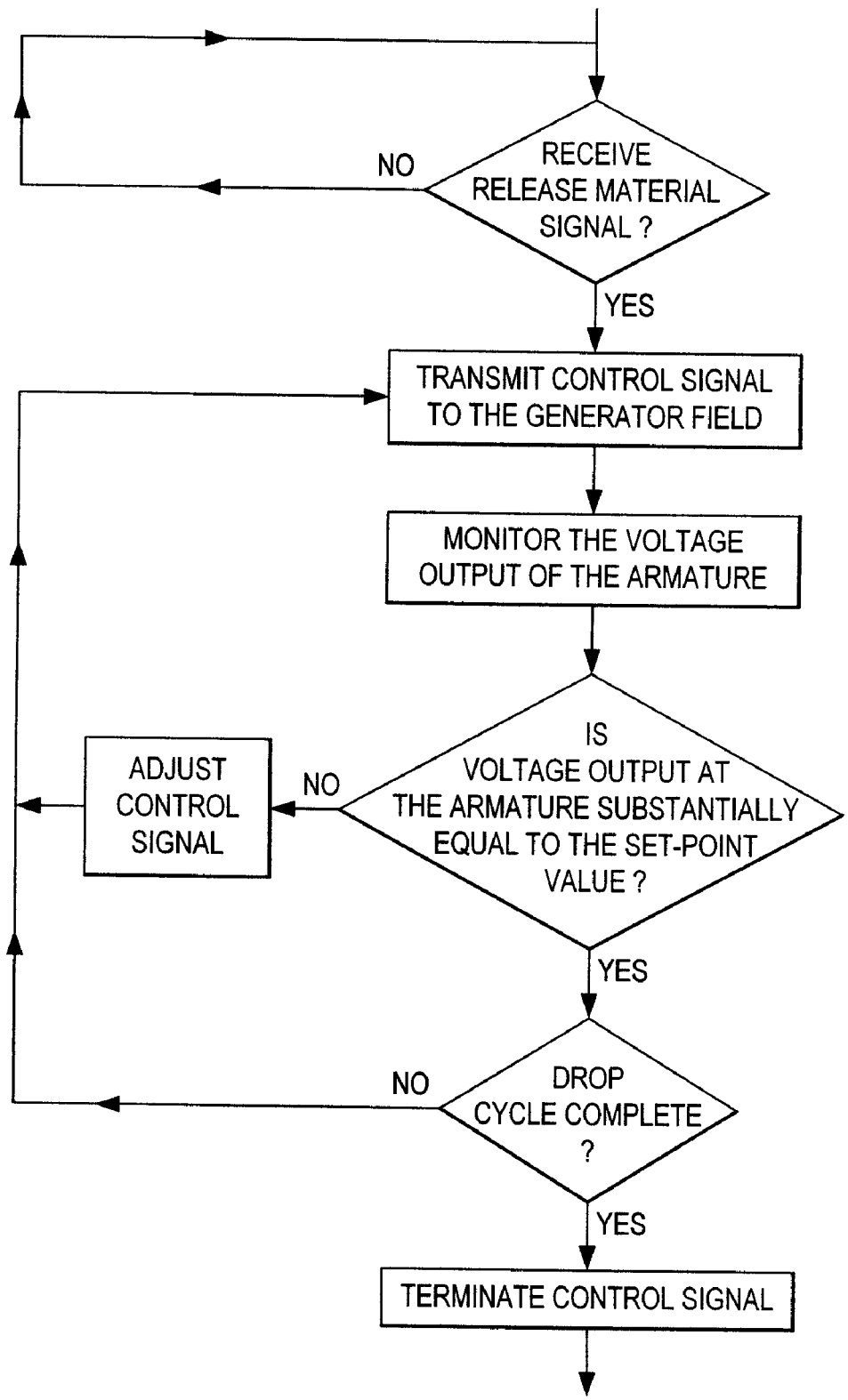
FIG. 5 is a flow chart of a method of one embodiment of the innovation for controlling an electromagnet during the release of magnetic material.

Referring now to FIG. 5, a flowchart is depicted for a method of controlling an electromagnet during the release of magnetic material in accordance with one embodiment of the innovation. The release of the magnetic material from the electromagnet is initiated by a release material signal transmitted from the interface control panel 14 and being received by the programmable logic controller 16. A control signal—drop—is transmitted from the programmable logic controller 16 to the generator field 18. The voltage output 24 of the generator armature 22 is monitored and compared against the earlier determined analog set-point value, wherein subsequent control signals are transmitted from the PLC 16 to maintain the output voltage 14 of the armature 22.

A further aspect of the innovation is directed to a safety feature for magnetic material moving machines, wherein ground fault protection, e.g., ground fault circuit interrupt (GFCI), is provided within the operating circuitry for open-loop and closed-loop systems. In particular, protection may be provided for interrupting operation of the lifting device when a leakage of electrical current to ground is detected and measured above safe operating levels, e.g., 5 mA within a maximum elapsed time of 25 mS—irrespective of the electromagnet lifting apparatus operating in a lift or drop mode.

Some known fault protection mechanisms include a residual current device (RCD)—which is similar to a residual current circuit breaker (RCCB)—and is an electrical component that inactivates, e.g., interrupts, a circuit's operation whenever an imbalance in electrical current is detected between an energized conductor and a return neutral conductor. Such an imbalance may sometimes be caused by a leakage of electrical current through a human body, which inadvertently comes into contact with an energized part of the circuit, and perhaps resulting in serious injury.

Figure 6:
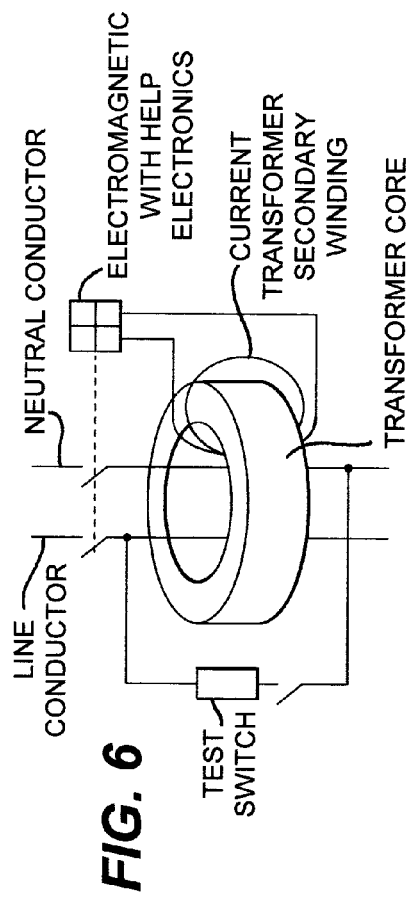
FIG. 6 is a sketch of a common residual current device (RCD)

RCDs operate by measuring and monitoring the current balance between two conductors using a differential current transformer and are designed to quickly disrupt operation of the circuitry in sufficient time to mitigate harm that may be caused by such shocks—although they are not intended to provide protection against overload or short-circuit conditions. Referring to FIG. 6, the RCD will open its contacts when it detects a difference in electrical current between the live conductor and the neutral conductor. That is, the supply and return currents must sum to approximately zero; otherwise, a leakage of current has occurred, e.g., to earth, ground, or another circuit.

One embodiment of the safety aspect of the innovation is directed to incorporating similar "RCD" circuit-breaker functionality into lifting machines that utilize electromagnets, which present several issues that should be taken into consideration for the circuit interrupt to be effective; such as, the standard parameters of GFCI operation, i.e., speed and electrical current threshold of operation, e.g., 5 mA within 25 mS.

One important consideration is the DC nature of the applied voltage utilized in the lifting machine being DC and therefore not able to be effectively measured using the current transformer, CT, shown in FIG. 6. That is, the voltage applied to the electromagnet of the lifting device is bipolar during normal operation and therefore does not supply a "common" or "neutral," (N), within its circuitry. In fact, both conductors in the electromagnetic lifting device serve as a common and a power during normal operation.

Figure 7:
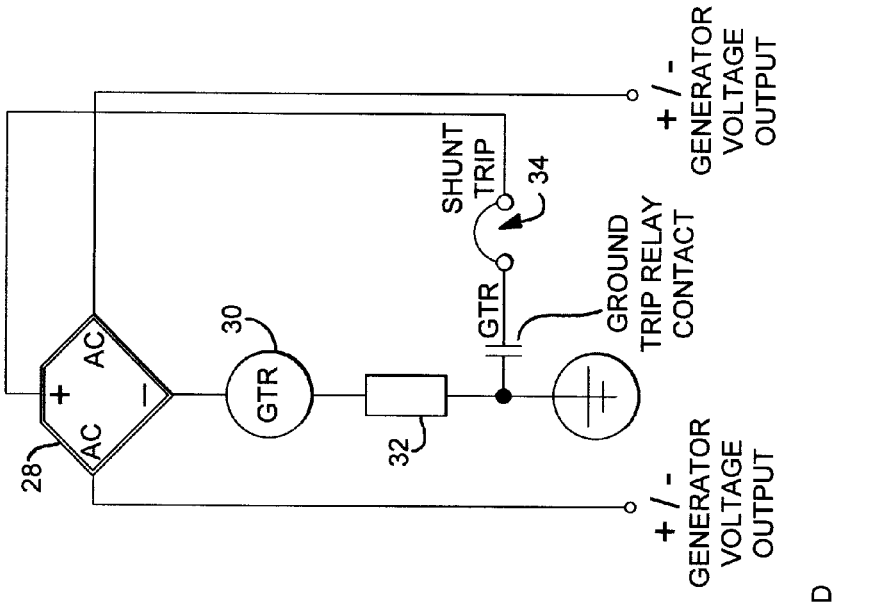
FIG. 7 is a schematic diagram of the ground-fault-current-interrupt circuit of one embodiment of the innovation capable of being utilized in an open-loop system.

The innovation provides GFCI protection to an open-loop system for moving magnetic material by incorporating the AC to DC rectifier circuit shown in FIG. 7. In particular, the generator's source voltage is passed through the AC to DC rectifier bridge 28 at its coupled AC terminals, which aligns or polarizes the input signal at the positive (+) terminal of the rectifier bridge. A ground trip relay (GTR) coil 30 and contact, and a sizing resistor 32, preferably 30 kΩ, are coupled between the negative (−) terminal and ground. The positive (+) terminal of the AC to DC rectifier 28 powers one side of a shunt trip mechanism 34. If at any time during operation the ground potential rises to a level above the predetermined specified setting, e.g., 5 mA, the coil of the GTR 30 will become sufficiently energized and close, which will then provide a trip contact that will open the shunt trip 34. The shunt trip auxiliary contact (not shown) can be coupled in line with the lifting device's controller wherein an interrupt signal and the like can be generated in response to the fault and subsequently utilized to cease operation of the process within the specified parameters, e.g., within 25 ms.

Another innovative safety aspect regarding the safe operation of the electromagnet moving apparatus is directed to monitoring prescribed safe levels of leakage current—i.e., less than 5 mA—notwithstanding the dynamic relationship between the applied generator voltage and the leakage resistance.

Figure 8:
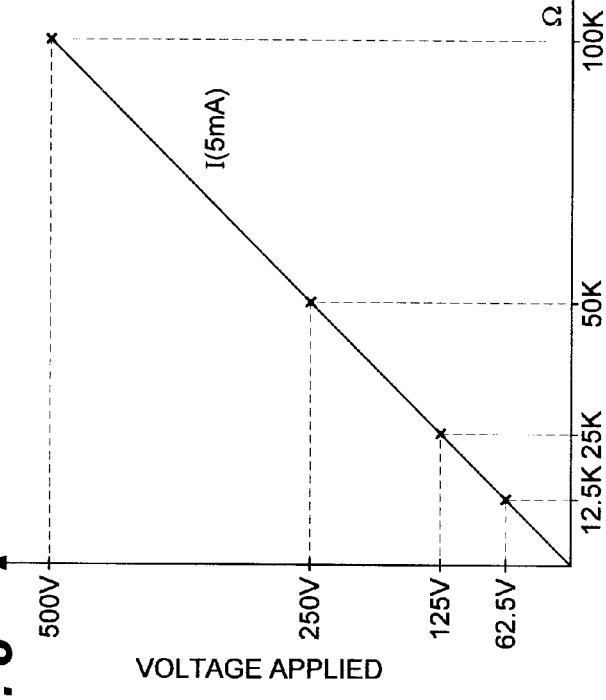
FIG. 8 is a graph depicting the dynamic relationship of the applied generator voltage versus the leakage ground; and, FIG. 9 is a schematic diagram of the ground fault protection current of the innovation for an open-loop system.

In one embodiment of the GFCI circuit of FIG. 7, GTR 30 is a 115 V AC relay and resistor 32 is 30 kΩ. It is understood that the normal pull-in for GTR 30 without a current limiting resistor is 10 Vdc at 2 mA+/−10%. As seen in the graph in FIG. 8, the amount of leakage current associated with tripping or interrupting the GFCI circuit of FIG. 7 is contingent upon the level of applied generator voltage and the leakage resistance to ground. In the upper right section of the graph of FIG. 8, standard magnet operation requires greater than 100 kΩ of resistance to ground at an applied generator voltage of 500 V; and the linear relationship of the leakage current is maintained with respect to the variable relationship of the applied generator voltage and leakage resistance to ground wherein 250 V requires 50 kΩ, 125 V requires 25 kΩ, and 62.5 V requires 12.5 kΩ. Thus, the innovative safety aspect of the innovation is capable of detecting unsafe operating conditions at various levels of applied generator voltages—e.g., at higher applied generator voltages wherein a lesser current leakage can have adverse effects; as well as at lower applied generator voltages, wherein a relatively higher current leakage is necessary to exceed the system's monitored operating conditions.

Figure 9:
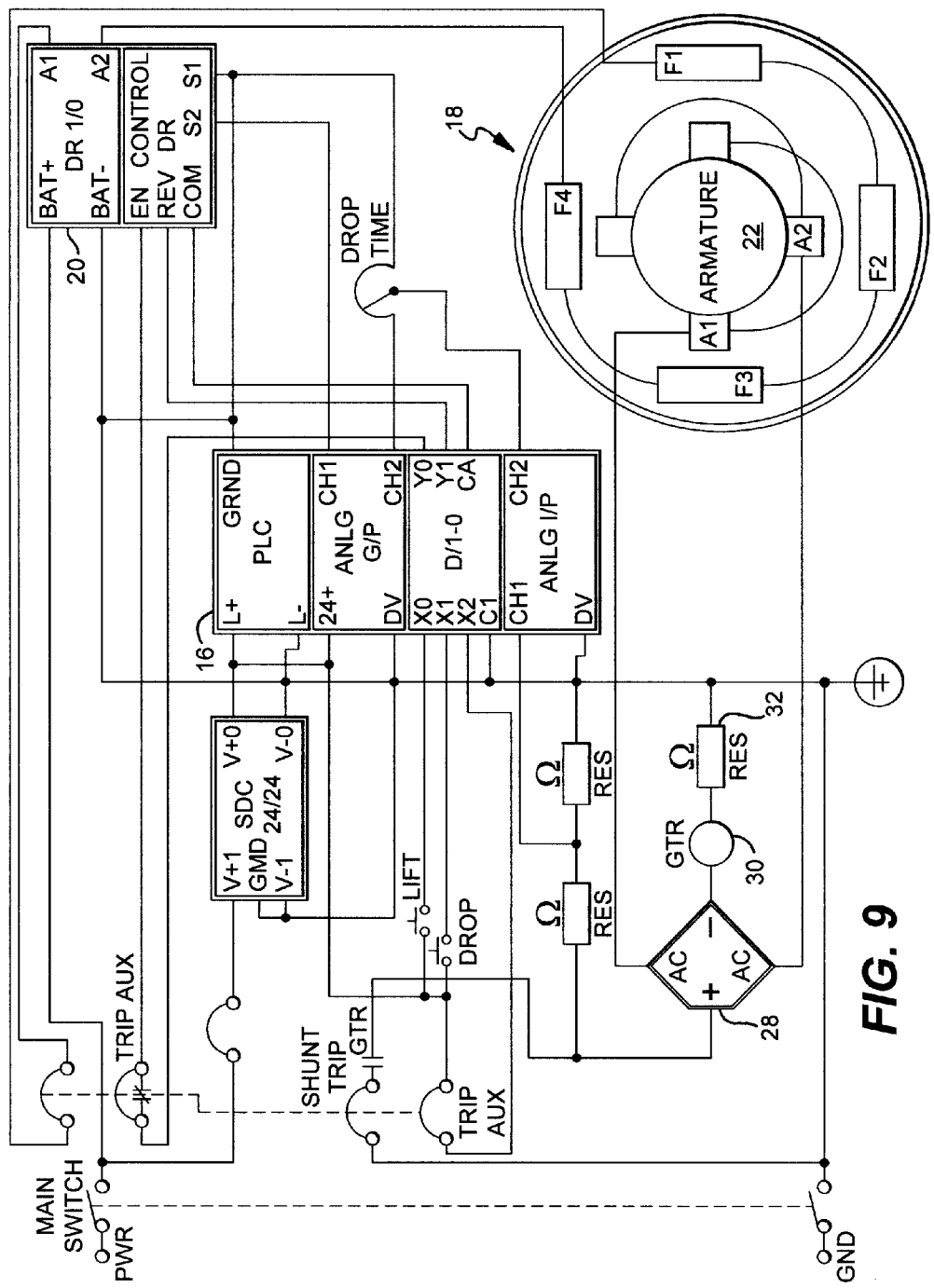

The circuit protection of FIG. 7 is particularly useful in open-loop systems wherein the generator's armature is intermittently coupled to the electromagnet. FIG. 9 depicts a partial schematic circuit wherein the protective circuit of FIG. 7 is operatively coupled to a control circuit similar to that shown in FIG. 2.

Another safety aspect of the innovation is directed to resolving the effects of ground leakage in a material mover utilizing a closed-loop system wherein the armature is always connected to the electromagnet and related feedback is capable of being provided to the PLC 16. Referring again to FIG. 2, the AC to DC rectifier bridge 28 is operatively coupled to the generator's armature 22. The positive (+) terminal of the AC to DC rectifier bridge 28 is coupled through a voltage divider to input CH1 of the PLC's 16 analog card; and the negative (−) terminal of the AC rectifier bridge is operatively coupled to ground. Output CHA of the PLC's 16 analog card 19 is operatively coupled to a first input, S1, of the bidirectional driver 20. A second input, S0, of the bidirectional driver 20 is operatively coupled to ground. The bidirectional driver 20 is also operatively coupled via its ports A1 and A2 to the field windings 18, F1, F2, etc., of the generator 17.

The PLC analog card 19 and the bi-directional driver 20 are respectively coupled to the same circuit ground; and the analog signal output, CHA—measured with respect to circuit ground—is coupled to the input of the analog receiver of the bi-directional driver 20. In normal operating conditions, circuit ground is approximately 0 V; if however, the circuit ground becomes "charged" by for example an electrical leakage from the output of the generator, it will begin to rise above 0 V. The elevated voltage level of the circuit ground will cause a directly proportional loss of the analog input signal and therefore reduce the output voltage being driven into the bi-directional drive at S0 and S1. For example, if the analog output voltage of the PLC is 5 V as measured with respect to 0 V (that is, operationally coupled to circuit ground) in normal operation, then the coinciding output of the bi-directional drive 20 is 100%. If the circuit ground becomes charged by an external output however, (e.g., perhaps by the generator) the effective signal being output by the bi-directional driver 20 will be proportionally reduced by the amount of voltage rise in the circuit ground. That is, if the circuit ground rises to 2.5 V from 0 V, the effective signal being output by the bi-directional drive will be 2.5 V, instead of 5 V—a 50% reduction, and operation of the electromagnet will be affected accordingly. If the leakage effect were to raise the circuitry's ground to 5 V, the effective signal output from the bi-directional driver 20 and received at the generator's field windings would in turn lower the signal level to 0 V.

It is to be understood that the innovation may be embodied in other specific forms without departing from the spirit or central characteristics thereof. That is, any type of electrical components known to one of ordinary skill in the field of electrical circuit design that are capable of being utilized to accomplish the objects described herein are contemplated by the innovation. The disclosed embodiments, therefore, are to be considered in all respects as illustrative and not restrictive, and the innovation is not to be limited to the details provided herein. Thus, while specific embodiments have been illustrated and described, numerous modification come to mind without significantly departing from the characteristics of the innovation and the scope of protection is only limited by the scope of the accompanying claims.

What is claimed is:

1. A safety circuit of an open-looped system for controlling an electromagnetic lifting device powered by a generator voltage source, the safety circuit comprising:
   an AC to DC rectifier bridge having two AC inputs, a positive output, and a negative output, the two AC inputs being operatively coupled to the generator voltage source;
   a ground trip relay coil including a predetermined safe current level, the ground trip relay coil being operatively coupled to the negative output of the AC to DC rectifier bridge;
   a sizing resistor operatively coupled between the ground trip relay coil and ground; and,
   a shunt trip and ground trip relay contact operatively coupled in series between the positive terminal of the generator source and ground, wherein detection of a current level above the safe current level will energize the ground trip relay coil, tripping the ground trip relay contact, and opening the shunt trip.

2. The safety circuit of claim 1, further comprising an interrupt signal generated in response to the detection of the current level above the safe current level.

* * * * *